SEMICONDUCTOR JUNCTION POWER DIODE AND METHOD OF MAKING SAME

Filed Aug. 12, 1955

INVENTORS
CHARLES E. HOULE
ARTHUR J. ZETES
BY William J. Flynn
ATTORNEY

United States Patent Office 2,853,661

Patented Sept. 23, 1958

2,853,661

SEMICONDUCTOR JUNCTION POWER DIODE AND METHOD OF MAKING SAME

Charles E. Houle, Whittier, Calif., and Arthur J. Zetes, Dorchester, Mass., assignors, by mesne assignments, to Clevite Corporation, Cleveland, Ohio, a corporation of Ohio Application August 12, 1955, Serial No. 528,030

7 Claims. (Cl. 317—234)

This invention relates to a semiconductor junction diode and to a method of making such a diode.

Previous to the present invention, in the construction and assembly of semiconductor junction diodes serious difficulties have been encountered in soldering the base electrode to the metal can in which the semiconductor junction unit is encapsulated. To provide an effective hermetic seal it was necessary to perform this soldering step at so high a temperature that the electrical characteristics of the semiconductor junction unit were adversely affected. At lower soldering temperatures, which would not injure the electrical characteristics of the semiconductor junction unit, the hermetic seal between the can and the base electrode was inadequate.

The present invention is directed to a novel semiconductor junction diode construction and to a method of making the same which avoid the foregoing difficulties.

Accordingly, it is an object of the present invention to provide a novel and improved hermetically sealed semiconductor junction diode.

It is also an object of this invention to provide a novel method of making a hermetically sealed semiconductor junction diode.

Another object of this invention is to provide a novel method of making a semiconductor junction diode which is particularly well suited for the manufacture of such diodes on an economical production basis.

Other and further objects and advantages of the present invention will be apparent from the following description of a preferred embodiment thereof, illustrated in the accompanying drawing.

Figure 1:
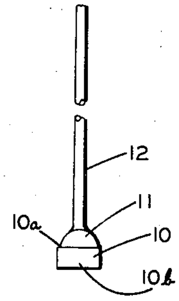
Figure 1 is an elevation showing the semiconductor rectifier junction having an electrode wire soldered thereto.

Referring first to Fig. 1, in accordance with the present invention there is provided a small semiconductive germanium body 10 of N-type conductivity having alloyed to one of its major faces 10*a* an indium dot 11, the alloying preferably being carried out in a furnace under a hydrogen atmosphere. During alloying the indium penetrates into the germanium and establishes a semiconductive germanium-indium region of P-type conductivity separated from the N-type germanium by a rectifying junction barrier. An anode lead wire 12 is then soldered to the indium dot 11.

In accordance with the present invention, the germanium-indium rectifier junction unit 10, 11 is mounted on a cup-shaped metal member 13, which is of pre-tinned "Kovar," "Kovar" being a cobalt-nickel-iron alloy used extensively in electronic components for hermetically sealing to glass, a typical embodiment of which is disclosed in United States Letters Patent 1,942,260. This cup-shaped member 13 has a central depressed flat mounting portion 14 surrounded by an annular, upraised channel-shaped segment 14*a*, which terminates in a depending cylindrical flange 15 disposed perpendicular to the plane of the flat mounting portion 14. The germanium-indium rectifier junction unit 10, 11 is positioned on the cup-shaped member 13 with the other face 10*b* of the germanium body 10 seated on the flat inner face 14 of the mounting portion 14. A ring of soldering preform is positioned on face 14*b* extending around the germanium body 10. The solder then is melted to solder the germanium-indium rectifier junction unit 10, 11 at 16 to the cup-shaped member 13, as shown in Fig. 2.

Figure 2:
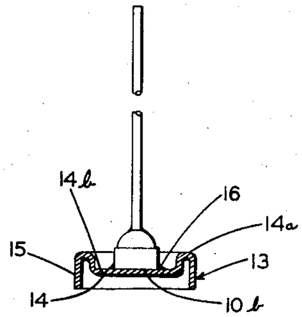
Figure 2 shows the Fig. 1 unit soldered to a cup-shaped metal member in accordance with one step in the present invention.

Following this, the assembly of Fig. 2, consisting of the semiconductor junction unit 10, 11 soldered to the cup-shaped member 13 and the electrode wire 12, is electro-etched and cleaned in a manner consistent with the type of diode characteristics desired.

Figure 3:
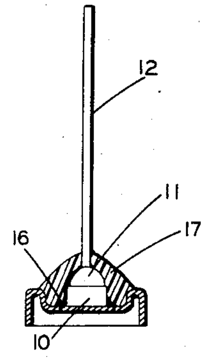
Figure 3 is a view similar to the Fig. 2 assembly after wax has been applied to seal the semiconductor rectifier junction.

Next, wax 17 is applied around the semiconductor junction unit 10, 11 on the cup-shaped member 13 to protect the junction unit from humidity. As shown in Fig. 3, this leaves the semiconductor junction unit 10 completely enclosed by the cup-shaped member 13, the wax 17 and the electrode wire 12.

Figure 4:
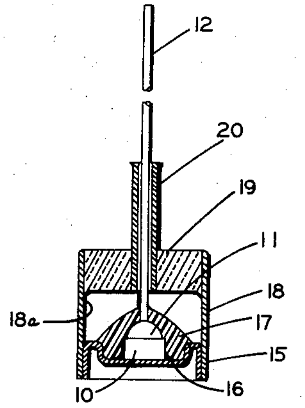
Figure 4 is a longitudinal section showing the Fig. 3 unit inserted within a can.

Following this, the assembly of Fig. 3 is inserted into one end of a cylindrical, cleaned, tin plated "Kovar" can 18. At one end the can 18 is plugged by an annulus 19 of glass. A metal tube 20 extends through this annulus and receives freely the elongated electrode wire 12 when the semiconductor junction unit is inserted into the can. The cylindrical flange 15 on the cup-shaped member 13 has an interference fit with the cylindrical inner wall 18*a* of can 18. This interference fit, in addition to providing a good electrical connection between the can 18 and the cup-shaped member 13, gives a measure of hermetic sealing between these members. Preferably, the semiconductor unit is inserted into the can 18 until the end of flange 15 on the cup-shaped member 13 is flush with the end of the can, as shown in Fig. 4.

A soldering preform ring is placed around the can 18 at the end into which the semiconductor junction assembly 10, 11, 12, 13 was inserted, and a cleaned, tin plated "Kovar" base 21 (Fig. 5) is positioned abutting against, and extending completely across, this end of can 18. Base 21 is provided with a lead-in wire 23 soldered to its opposite face. The assembly of can 18 and base 21 is placed in the field of an induction heater for a sufficient length of time to solder the base 21 to the can 18. Because both the base 21 and the can 18 are cleaned and pre-tinned, they are soldered to each other at a soldering temperature low enough that the electrical characteristics of the rectifier junction within the can are not appreciably affected adversely. The free flow of the solder 22 effects a good hermetic seal between the base 21 and the can 18 entirely around the outer surface of the can at one end, as shown in Fig. 5.

The electrode wire 12 is then welded to the tube 20 and the remaining gap between this electrode wire and the tube is closed with solder.

In addition to soldering the base 21 to the can 18 at a temperature low enough to avoid damaging the electrical properties of the junction unit, the present invention has been found to be advantageous in that a better hermetic seal is obtained between the base and the can. Furthermore, attaching the semiconductor junction unit 10, 11 to a separate metal member other than base 21 eliminates the necessity of cleaning the base just before soldering it to the can 18, which formerly was required to facilitate this soldering step. Because of these practical advantages, the process of the present invention is particularly adapted for the manufacture of semiconductor junction diodes on a mass production basis at an economically feasible cost.

Figure 5:
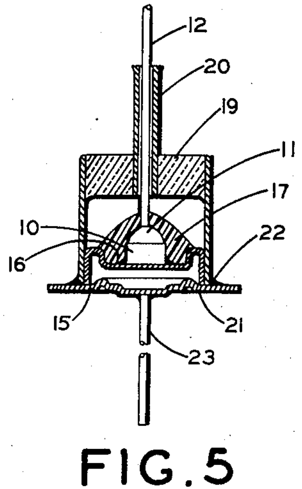
Figure 5 is a longitudinal section showing the complete assembly of the present diode.

Also, the semiconductor junction unit shown in Fig. 3 is in itself a complete diode and may be encapsulated somewhat differently than as shown in Fig. 5 to suit the specific requirements of the customer.

It is to be understood that, while there has been disclosed in the foregoing description and the accompanying drawing a specific preferred embodiment of the present invention, various modifications, omissions and refinements which depart from the disclosed embodiment may be adopted without departing from the spirit and scope of the present invention. For example, the semiconductor junction unit can be any suitable P–N junction and is not limited to the particular germanium-indium unit mentioned above.

We claim:

1. In a method of making a semiconductor junction diode, the improvement which comprises the steps of: providing an integrated semiconductor junction unit including semiconductive portions of opposite conductivity types separated by a rectifying junction; providing a flanged metal member having a mounting portion and a flange extending transverse to said mounting portion; attaching said semiconductor junction unit at one side of rectifying junction to said mounting portion; inserting said flanged member with the semiconductor junction unit thereon into the open end of a metal can with the semiconductor junction unit disposed within the can ahead of said flange and with said flange having a tight fit in the can; positioning a metal base extending completely across said open end of the can and abutting against said open end of the can; and soldering said base to the outer wall of the can thereat.

2. In a method of making a semiconductor junction diode, the improvement which comprises the steps of: providing an integrated semiconductor junction unit including semiconductive portions of opposite conductivity types separated by a rectifying junction and an electrode wire attached to the semiconductive portion at one side of said rectifying junction; providing a flanged metal member having a mounting portion and a flange extending transverse to said mounting portion; soldering the other semiconductive portion to said mounting portion; applying electrically non-conductive moisture resistant material around the semiconductor junction unit on said flanged member; inserting said flanged member with the semiconductor junction unit thereon into the open end of a metal can with the semiconductor junction unit disposed within the can ahead of said flange and with said flange having a tight fit in the can; positioning a metal base extending completely across said open end of the can and abutting against the open end of the can; and soldering said base to the outer wall of the can thereat.

3. In a method of making a semiconductor junction diode, the improvement which comprises the steps of: providing an integrated semiconductor junction unit including semiconductive portions of opposite conductivity types separated by a rectifying junction and an electrode wire attached to said semiconductor unit at one side of said rectifying junction; providing a cup-shaped metal member having a substantially flat mounting portion and a transverse annular flange around said mounting portion; soldering said semiconductor unit at the other side of said rectifying junction to said mounting portion; sealing the semiconductor junction unit to contiguous surfaces of said cup-shaped member with wax; inserting said cup-shaped member with the semiconductor junction unit thereon into the open end of a pre-tinned metal can with said electrode wire projecting through the opposite end of the can and with the flange on said cup-shaped member having a tight fit in the can; positioning a substantially flat pre-tinned metal base extending completely across said open end of the can and abutting against the open end of the can; and soldering said base to the outer wall of the can to provide a hermetic seal thereat.

4. A method of making a semiconductor alloy junction diode which comprises the steps of: alloying to one face of a semiconductor body of one conductivity type a doping metal which forms a rectifying junction with the semiconductor body; soldering an electrode wire to said doping metal; providing a cup-shaped metal member having pre-tinned mounting portion and a transverse flange around said mounting portion; soldering the opposite face of the semiconductor body to said mounting portion; electro-etching and cleaning the semiconductor body and the doping metal alloyed thereto; enveloping the semiconductor body, the doping metal alloyed thereto, and contiguous surfaces of the cup-shaped member with electrically non-conductive, moisture-resistant material; inserting said cup-shaped member with the semiconductor junction unit thereon into the open end of a pretinned metal can with said electrode wire projecting through the opposite end of the can and with the flange on said cup-shaped member having a close fit in the can; positioning a pre-tinned metal base extending completely across said open end of the can and abutting against the open end of the can; soldering the base to the outer face of the can at said open end of the can at a temperature sufficiently low to avoid damage to the rectifying junction between the semiconductor body and the doping metal thereon; and providing a hermetic seal between said electrode wire and the opposite end of the can.

5. A method of making a semiconductor alloy junction diode which comprises the steps of: alloying to one face of a semiconductor body of one conductivity type a doping metal which forms a rectifying junction with the semiconductor; soldering an electrode wire to said doping metal; providing a cup-shaped metal member having a substantially flat pre-tinned mounting portion and a transverse cylindrical flange around said mounting portion; soldering the opposite face of the semiconductor body to said mounting portion; electro-etching and cleaning the semiconductor junction unit composed of the semiconductor body and the doping metal alloyed thereto; enveloping the semiconductor junction unit on said cup-shaped member and contiguous surfaces of said member with wax; inserting said cup-shaped member with the semiconductor junction unit thereon into the open end of a pre-tinned metal can with said electrode wire projecting through the opposite end of the can and the flange on said cup-shaped member having a close fit in the can; positioning a pretinned metal base extending completely across said open end of the can and abutting against the open end of the can; soldering the base to the outer face of the can at said open end of the can at a temperature sufficiently low to avoid damage to the electrical characeteristics of the semiconductor junction unit; and establishing a hermetic seal between said electrode wire and the opposite end of the can.

6. A semiconductor diode assembly comprising a metal can, a metal base extending completely across one end of the can and soldered to the can thereat to provide a hermetic seal at said end of the can, a flanged metal member within the can having a mounting portion and a flange extending transverse to said mounting portion, said flanged member having its mounting portion positioned inwardly from said end of the can and its flange tightly engaging the can adjacent said one end of the can, a semiconductor junction unit having a rectifying junction separating semiconductive portions of opposite conductivity types, said semiconductor junction unit being mounted on said mounting portion of said flanged member with said mounting portion contacting the semiconductor junction unit at one side of the rectifying junction therein, an electrode wire connected to said semiconductor unit at the opposite side of said rectifying junction therein, and means providing a seal between said electrode wire and the can.

7. An alloy junction power diode assembly comprising a cylindrical metal can, a metal base extending completely across one end of the can abutting against said end of the can and soldered to the outer wall of the can to provide a hermetic seal with the can thereat, a cup-shaped metal member having a flat mounting portion disposed within the can and a transverse cylindrical flange having a tight fit with the inner wall of the can and terminating at said end of the can, a semiconductor body of one conductivity type soldered at one end to said mounting portion on said cup-shaped member, doping metal alloyed to the opposite end of the semiconductor body and providing a semiconductive region of the opposite conductivity type separated from said semiconductor body by a rectifying junction, a mass of wax surrounding the semiconductor body and the doping metal on said cup-shaped member, an electrode wire soldered to said doping metal and extending through the other end of the can, and means providing a hermetic seal between said other end of the can and the electrode wire.

References Cited in the file of this patent

UNITED STATES PATENTS

| | | |
|---|---|---|
| 2,588,956 | Brittain et al. | Mar. 11, 1952 |
| 2,665,399 | Lingel | Jan. 5, 1954 |
| 2,703,855 | Koch et al. | Mar. 8. 1955 |